(12) United States Patent
Pfeuffer et al.

(10) Patent No.: US 9,797,969 B2
(45) Date of Patent: Oct. 24, 2017

(54) METHOD AND MAGNETIC RESONANCE APPARATUS TO GENERATE A SPATIALLY SELECTIVE EXCITATION

(71) Applicant: Siemens Aktiengesellschaft, Munich (DE)

(72) Inventors: Josef Pfeuffer, Kunreuth (DE); Rainer Schneider, Hoechstadt (DE)

(73) Assignee: Siemens Aktiengesellschaft, Munich (DE)

( * ) Notice: Subject to any disclaimer, the term of this patent is extended or adjusted under 35 U.S.C. 154(b) by 366 days.

(21) Appl. No.: 14/484,576

(22) Filed: Sep. 12, 2014

(65) Prior Publication Data

US 2015/0070011 A1    Mar. 12, 2015

(30) Foreign Application Priority Data

Sep. 12, 2013    (DE) .................. 10 2013 218 279

(51) Int. Cl.
*G01R 33/36* (2006.01)
*G01R 33/48* (2006.01)
*G01R 33/483* (2006.01)
*G01R 33/56* (2006.01)

(52) U.S. Cl.
CPC ......... *G01R 33/4818* (2013.01); *G01R 33/36* (2013.01); *G01R 33/4833* (2013.01); *G01R 33/4836* (2013.01); *G01R 33/5608* (2013.01)

(58) Field of Classification Search
CPC .. A61B 5/055; G01R 33/5612; G01R 33/288; G01R 33/5611; G01R 33/3607; G01R 33/4824; G01R 33/3635; G01R 33/4818; G01R 33/482–33/4836
See application file for complete search history.

(56) References Cited

U.S. PATENT DOCUMENTS

| 7,265,545 | B2 * | 9/2007 | Kruger | ................. | G01R 33/561 |
| | | | | | 324/307 |
| 2010/0066362 | A1 * | 3/2010 | Ullmann | ............ | G01R 33/4836 |
| | | | | | 324/309 |
| 2010/0286504 | A1 | 11/2010 | Mistretta et al. | | |

FOREIGN PATENT DOCUMENTS

JP    H07241280 A    9/1995

OTHER PUBLICATIONS

Pauly et.al. :"A k-Space Analysis of Small-Tip-Angle Excitation", in Journal of Magnetic Resonance, vol. 81, pp. 43-56, (1989).
(Continued)

*Primary Examiner* — Clayton E Laballe
*Assistant Examiner* — Ruifeng Pu
(74) *Attorney, Agent, or Firm* — Schiff Hardin LLP (57) ABSTRACT

In a method to generate a spatially selective excitation in an imaging region of a magnetic resonance apparatus that precedes an acquisition of magnetic resonance data, in the course of the excitation an excitation trajectory in k-space is traversed, the excitation trajectory having a symmetry relative to the k-space center in at least one direction of k-space in the sense that a first traversed extreme value in this direction corresponds to the negative of the other extreme value traversed in this direction, so the excitation trajectory is shortened in the at least one directions on one side of the zero point between the extreme values, and the shortened excitation trajectory is used for excitation.

20 Claims, 6 Drawing Sheets

(56) References Cited

OTHER PUBLICATIONS

McGibney et al. "Quantitative Evaluation of Several Partial Fourier Reconstruction Algorithms Used in MRI; Quantitative Evaluation of Several Partial Fourier Reconstruction Algorithms Used in MRI," Magnetic Resonance in Medicine, vol. 30, pp. 51-59 (1993).
Riesenberg et al: "Two-Dimensional Spatially-Selective RF Excitation Pulses in Echo-Planar Imaging", Magnetic Resonance in Medicine vol. 47, pp. 1186-1193, (2002).
Stenger et al.; "Three-Dimensional Tailored RF Pulses for the Reduction of Susceptibility Artifacts in T*2-Weighted Functional MRI," Magnetic Resonance in Medicine vol. 44 pp. 525-531 (2000).
Schroder et al: "Spatial Excitation Using Variable-Density Spiral Trajectories", Journal of Magnetic Resonance Imaging, vol. 18, pp. 136-141, (2003).
Schneider et al., "Inner-Volume Imaging In Vivo Using Three-Dimensional Parallel Spatially Selective Excitation", Magnetic Resonance in Medicine pp. 1-12, (2012).
Alley et al. "Angiographic imaging with 2D RF Pulses", Magn Reson Med, vol. 37(2) pp. 260-267 (1997).
Bernstein et al. Radiofrequency Pulse Shapes, Chapter 2,; Handbook of MRI Pulse Sequences, SINC Pulses, p. 38 (2004).
Wajer et al.: "MRI Scan Time Reduction by Asymmetric Spiral Sampling"; Applied Physics; Delft University of Technology (NL); Université Claude Bernard Lyon (FR); Proc. PRORISC 2001, IEEE Benelux, Veldhoven(NL); pp. 728-733; ( 2001;).

* cited by examiner

METHOD AND MAGNETIC RESONANCE
APPARATUS TO GENERATE A SPATIALLY
SELECTIVE EXCITATION

BACKGROUND OF THE INVENTION

Field of the Invention

The invention concerns: a method to generate a spatially selective excitation in an imaging region of a magnetic resonance apparatus that precedes an acquisition of magnetic resonance data, wherein an excitation trajectory in k-space is traversed in the course of the excitation; as well as a magnetic resonance apparatus for implementing such a method.

Description of the Prior Art

Magnetic resonance imaging and its principles are widely known. A subject to be examined is introduced into an imaging region of a magnetic resonance apparatus in which a basic magnetic field with a relatively high field strength (known as the B0 field) is present. In order to be able to acquire magnetic resonance data from a subject in the imaging region (in a slice, for example), the nuclear spins of this slice are excited and the decay of this excitation is detected as a signal. Gradient fields can be generated by a gradient coil arrangement while radio-frequency excitation pulses (which are commonly designated as radio-frequency pulses) are emitted by a radio-frequency coil arrangement. A radio-frequency field (typically designated as a B1 field) is generated by the entirety of the radio-frequency pulses, and the spins of nuclei that are excited to resonance are flipped (deflected) with spatial resolution by an amount known as a flip angle, relative to the magnetic field lines of the basic magnetic field. The excited spins of the nuclei then emit radio-frequency signals that can be received and processed further by suitable reception antennas (such as the aforementioned radio-frequency coil arrangement) in order to thus acquire magnetic resonance data and reconstruct magnetic resonance images.

A multitude of possibilities have been proposed to produce excitations in a spatially selective manner. Such spatially selective (mostly multidimensional) radio-frequency pulses are often used together with fast imaging methods, for example echoplanar imaging (EPI). The resulting combination is a well-known technique in order to realize what is known as imaging with a reduced field of view (rFOV). In this way, a marked reduction of the readout and acquisition duration for the magnetic resonance data can be achieved since fewer coding steps are required. For example, a reduction of the readout and acquisition duration by a factor of 2-4 can be achieved. An additional advantage of the rFOV technique is the reduction of susceptibility-induced distortions since off-resonance effects are likewise reduced with the reduction of the total readout duration. Upon transmission, a spatially selective excitation can be used for the rFOV technique. A saturation of the nuclear spins in order to avoid aliasing artifacts is also conceivable.

However, the rFOV technique also has disadvantages that also apply to other applications of spatially selective excitations. The radio-frequency pulses of a spatially selective excitation have a markedly longer duration in comparison to the typical sinc excitations. A two-dimensional radio-frequency pulse for a spatially selective excitation thus has a duration of 20-30 ms, for example, while a sinc pulse for single slice excitation has an excitation duration of 2-3 ms. This leads to two effects. One is that more off-resonance effects that negatively affect the image quality occur during the excitation, due to the longer duration. A second effect is that the effective echo time (TE), or the contribution of the excitation to TE, is markedly lengthened. The effective echo time is defined as the difference between the point in time at which the excitation trajectory in k-space traverses the k-space center and the point in time at which the readout trajectory in k-space traverses the k-space center. However, the longer the echo time, the sooner that the signal already decays, which results in a lower SNR (signal-to-noise ratio). This is due to the tissue relaxation time (T2*, T2).

Examples of rFOV applications are found in an article by Marcus T. Alley et al., "Angiographic Imaging with 2D RF Pulses", MRM 37:260-267 (1997), and in an article by Susanne Rieseberg et al., "Two-Dimensional Spatially-Selective RF Excitation Pulses in Echo-Planar Imaging", MRM 47:1186-1193 (2002). In particular, it is also shown how the excitation trajectories in k-space are realized by appropriate switching (activation) of gradients. Overall, such an excitation is thus formed by at least one radio-frequency pulse and gradient pulses.

One goal of previous examinations has been to keep the resulting echo time TE as short as possible. For rFOV imaging, it has been proposed to use spatially selective, multidimensional radio-frequency pulses that are based on naturally asymmetrical excitation trajectories. One example of this is trajectories known as "spiral-in trajectories", for example as described in the articles by Marcus T. Alley et al., "Angiographic Imaging with 2D RF Pulses", MRM 37:260-267 (1997), and in an article by Susanne Rieseberg et al., "Two-Dimensional Spatially-Selective RF Excitation Pulses in Echo-Planar Imaging", MRM 47:1186-1193 (2002). In such cases, in the excitation the fundamental design of the k-space center is reached only as the last point of the excitation trajectory, such that the TE contribution of the excitation is minimized. However, these approaches have other disadvantages, for example a poor robustness against hardware errors. An additional problem is that naturally asymmetrical radio-frequency pulses or complete excitations have smeared pulse responses (point spread functions—PSF). In contrast to this, spatially selective, multidimensional excitations that use a symmetrical excitation trajectory in k-space offer a more deterministic and robust point spread function, such that they are often preferred—in addition to the aforementioned articles, see also the articles by V. Andrew Stenger et al., "Three-Dimensional Tailored RF Pulses for the Reduction of Susceptibility Artifacts in T2*-Weighted Functional MRI", MRM 44:525-531 (2000) and Johannes T. Schneider et al., "Inner-Volume Imaging In Vivo Using Three-Dimensional Parallel Spatially Selective Excitation", MRM 2012.

SUMMARY OF THE INVENTION

An object of the invention is to provide a method for operating a magnetic resonance apparatus for spatially selective excitation, which enables a shorter excitation duration and in particular a shorter echo time of the magnetic resonance sequence, without severe losses in the excitation quality.

This object in a method of the aforementioned type but wherein, according to the invention, an excitation trajectory is used that has symmetry relative to the k-space center in at least one direction of k-space in the sense that a first traversed extreme value in this direction corresponds to the negative of the other extreme value traversed in this direction, and this excitation trajectory is shortened in the at least one direction on one side of the zero point between the extreme values, and this shortened excitation trajectory is used for excitation.

In other words, an unmodified excitation trajectory in k-space is used that covers an interval of k-space that is symmetrical relative to the k-space center in the direction of symmetry, such that the symmetry conditions can be defined in formulas as follows. The excitation trajectory in k-space is $$k(t) = \begin{pmatrix} k_x(t) \\ k_y(t) \\ k_z(t) \end{pmatrix} = -\gamma \int \begin{pmatrix} g_x(\tau) \\ g_x(\tau) \\ g_x(\tau) \end{pmatrix} d\tau, \quad (1)$$

wherein g describes the corresponding gradients and the integral from t to the pulse duration is to be taken; the global extreme values (thus the minimum value and the maximum value) are $$k_{max} = \max \begin{pmatrix} k_x(t) \\ k_y(t) \\ k_z(t) \end{pmatrix} \text{ and } k_{min} = \min \begin{pmatrix} k_x(t) \\ k_y(t) \\ k_z(t) \end{pmatrix}. \quad (2)$$

As is known, in the prior art the actual extreme values result due to the desired spatial resolution, such that the symmetry condition for the excitation trajectory, which is completely symmetrical here relative to the k-space center (0, 0, 0), applies as a symmetry condition:

$$k_{max} = -k_{min} = \frac{1}{2\Delta s}. \quad (3)$$

Naturally, trajectories that are only partially symmetrical are also conceivable, for example trajectories for which the condition (3) is not vectorial but rather is valid only for a specific direction. These are naturally also useable in the method according to the invention.

In the at least one direction of symmetry, an interval between a maximum value and a minimum value is thus covered that includes a zero point of the direction due to the extent of the excitation trajectory around the k-space center. The interval that is symmetrical relative to the zero point in the direction of symmetry is now reduced on one side, but continues to include the zero point. A modified, shortened excitation trajectory is created that covers only the reduced interval, and consequently is traversed more quickly. It should be noted that, when the entire excitation trajectory is formed by partial trajectories, for example in different planes, a shortening of each partial trajectory is also conceivable, but it is advantageous (as will be explained in detail in the following) to then realize the shortening of the excitation trajectory by omitting entire partial trajectories, consequently in a direction orthogonal to the planes.

The invention thus utilizes the advantage of the symmetry or at least partial symmetry of the excitation trajectory in k-space, and achieves a less symmetrical traversal of excitation k-space without reducing the effective spatial resolution of the excitation. As shown by Formula (3), the latter is defined by the inverse of the maximum scanned k-space extent. Therefore, according to the invention, the maximum k-space extent of one half of the excitation trajectory is truncated to a defined degree. The spatial resolution is not affected by this because the first half of the excitation trajectory continues to supply the necessary coding.

By this shortening of the excitation trajectory, the entire excitation duration is reduced, such that the resulting echo time (TE) contribution can also be markedly reduced when, as is preferred within the scope of the present invention, the shortening takes place such that the portion of the excitation trajectory that remains after traversal of the k-space center via the excitation trajectory; the shortening preferably occurs entirely after traversal of the k-space center. In the latter cited case, the greatest possible gain with regard to the echo time is provided.

Due to the shortening of the excitation duration (consequently in particular also the shortening of the duration of the radio-frequency excitation pulse), fewer off-resonance effects—for example geometric distortions, smearings and signal loss—occur during this time. The reduction of the contribution at the echo time TE (wherein the aforementioned definition of the echo time, from the traversal of the k-space center by the excitation trajectory up to the traversal of the k-space center by the readout trajectory is again used) less signal decay occurs up to the readout process within the scope of the magnetic resonance sequence, such that a markedly higher signal-to-noise ratio (SNR) can be achieved. Moreover, a shorter minimum echo time can be achieved with smaller contribution to the echo time. It is noted that the excitation generated according to the invention can be used in any magnetic resonance sequence in which such spatially selective excitations can reasonably be used. The excitation is preferably used in EPI sequences.

A further advantage of the present invention is that no additional hardware whatsoever is required in order to implement the method. The invention can consequently be realized at all common magnetic resonance devices, such that a transmission device that is designed for parallel transmission is not required. However, a combination with a parallel transmission can be advantageous, which will be discussed in more detail in the following.

In a further embodiment of the invention, the shortening takes place by omission of planes covered by partial trajectories in k-space, which planes are situated orthogonal to the direction. This is a particularly advantageous embodiment of the present invention because excitation trajectories are known that ultimately result as a stack of partial trajectories, wherein just as many trajectories are arranged above the k-space center as below. If a portion of the partial trajectories to be traversed after the k-space center is now omitted or removed, a marked reduction of the excitation duration can be achieved which—in this particularly preferred example—can be completely transferred to a reduction of the contribution of the excitation to the echo time.

However, other embodiments are also conceivable wherein, for example, an excitation trajectory traversed in the direction of successive k-space values is shortened after crossing through the zero point of the direction, possibly in addition to the omission of planes or partial trajectories. For example, if k-space lines proceeding within a plane are traversed in succession, a portion of the k-space lines can be omitted or the k-space lines are shorted on one side. If only one plane in k-space is considered in this context, the advantages cited for the omission of planes can also be achieved; if this successive traversal of k-space points occurs in multiple planes that are situated around the k-space center, the reduction of the excitation duration is distributed approximately uniformly to the time segment before traversal of the k-space center and the time segment after traversal of the k-space center. Here as well, a certain reduction of the echo time is then possible.

For example, any of an echoplanar trajectory or a spiral stack or a radial scan trajectory can be used as the excitation trajectory. Such excitation trajectories in k-space are symmetrical with regard to at least one direction, and are fundamentally known in the prior art. Two-dimensional echoplanar trajectories traverse a rectangular region including the k-space center in a wandering manner. Given three-dimensional echoplanar trajectories, such two-dimensional echoplanar trajectories are provided as partial trajectories in multiple planes in k-space. A trajectory realized through a stack of spirals has spiral-shaped partial trajectories situated in multiple planes in k-space. Radial trajectories comprise multiple partial trajectories that respectively travel outward, starting from the k-space center.

A particularly advantageous description of the asymmetry is provided if the degree of asymmetry is described by an asymmetry factor that is less than 1, such that—in the direction which has been shortened—the extreme value on the side that has been shortened is determined as the negative of the other extreme value, multiplied by the asymmetry factor. If the convention introduced in equations (1) through (3) is assumed, then $$k_{max} = -\begin{pmatrix} \alpha_x \\ \alpha_y \\ \alpha_z \end{pmatrix} k_{min} \text{ with } 0 < \alpha \leq 1. \quad (4)$$

in the case in which, as presented, a symmetry is present in the x-direction, y-direction and z-direction. As has been presented, the introduction of an asymmetry in one direction is already sufficient in order to be able to execute the present invention, such that in Formula (4) it was formulated that a is less than or equal to 1, wherein naturally at least one less than 1 should be realized for application of the invention. $\alpha=1$ would in turn lead to a symmetrical excitation trajectory in the direction; $\alpha=0$ describes the maximum asymmetrical case. The association of minimum value and maximum value in Equation (4) is chosen at random without limitation of the generality; the reverse case is naturally also possible.

An advantageous range for the asymmetry factor have been shown to be between 0.5 and 1. If too severe a shortening of the excitation trajectory is performed, the risk of truncation artifacts ("truncation") exists, but too large an energy introduction per time unit could then be required, which is likewise undesirable. Distinct time games (and thus quality gains) can already be achieved with values from $\alpha=0.5$ to 0.9, for example, without the excitation quality decreasing too severely (as experiments and calculations have shown).

The design the asymmetry factor, or in general the degree of the asymmetry, can be selectable by a user. However, for a user it is complicated to always correctly estimate the trade-off between the time gain (and thus quality gain) due to the introduction of the symmetry and the quality loss with regard to the excitation. Another possibility within the scope of the invention is to hard-set the parameters determined from experimental values and/or tests and describing the introduced asymmetry—in particular the asymmetry factor—for specific applications. However, within the scope of the present invention an automatic determination of the degree of asymmetry is preferred that weights the trade-off between the time gain and the loss of excitation quality.

In an embodiment of the invention, the shortening of the trajectory in particular the determination of the asymmetry factor, takes place by execution of an optimization method wherein a loss of the excitation quality and a time gain with regard to the duration of the excitation and/or the echo time are considered with weighting. It should be noted that the time gain can also be formulated as a quality gain, for example a gain in the signal-to-noise ratio. Essentially two specific embodiments of such an automatic determination of the degree of asymmetry (in particular of the asymmetry factor) are conceivable, both of which are well-suited for implementation in parallel and, for example, can be executed in real time on common graphics cards.

In a version of first the optimization method, the pulse responses of different shortened excitation trajectories are determined and evaluated. For example, different asymmetry factors can be established and the pulse responses of the corresponding excitation trajectories can respectively be evaluated, for which—in the simplest case—a relative error measure can be established which describes the loss of the excitation quality in comparison to the symmetrical initial excitation trajectory. With this procedure, a reliable interval of asymmetry factors can be determined simply and quickly, which ensures a certain predetermined excitation quality given the most different scenarios (slice thickness to be excited, desired excitation region, required spatial resolution of the excitation etc.). The smallest asymmetry factor of the interval can then advantageously be chosen since the greatest time gain is then determined given allowable loss of excitation quality.

In a second alternative, a Bloch simulation is implemented (in particular to determine a loss of the excitation quality) in the optimization method using predetermined B1 maps and optional B1 maps for different shortened excitation trajectories. A significantly more precise method—in comparison to the consideration of the pulse responses, for example described by PSF (point spread functions)—is achieved given use of previously measured B1 maps and optional (likewise usable) B0 maps. B0 maps describe the deviation of the B0 field from the ideal magnetic field, for example via indication of a deviation of the local Larmor frequency from the nominal Larmor frequency of the magnetic resonance device. B1 maps reflect spatial sensitivity/excitation profiles of the at least one transmission channel or, respectively, of the associated at least one coil element of the radio-frequency coil. This method is particularly efficient if multiple transmission channels (parallel transmission—pTX) are used, since there the B1 maps and the B0 maps are required anyway to design excitation pulses and are consequently measured, in particular also for every examination subject. The evaluation of the excitation quality, and possibly of additional variables, for example the radio-frequency energy or the SAR, is then possible without more effort.

In this context it is advantageous for the Bloch simulation to also be implemented with regard to a complete magnetic resonance sequence to be implemented, which includes the excitation and/or a subject to be acquired, and values to be considered for the image quality and/or the SAR are determined within the scope of the optimization. Because the excitation qualities of excitation trajectories of different asymmetry factors can already basically be predicted with the B1 maps and the B0 maps by means of Bloch simulations, the Bloch simulations can also be expanded by the readout sequence as a proportion of the entire magnetic resonance sequence. A consideration of the T2* response of different nuclei is also conceivable. The signal-to-noise ratio (SNR) and the image quality can be estimated from this. A local minimum or an optimal asymmetry factor can be determined with incorporation of these different factors, in particular excitation quality, SAR, behavior of the pulse, time gain for the excitation, time gain for the echo time, SNR gain and/or additional factors.

For both embodiments just described, it is advantageous for the power to be emitted into the subject at a point in k-space to also be adapted as an additional parameter in the optimization method. This allows it to be insured that the SAR, in particular the local SAR, does not exceed defined limit values, because it can be thought of as being "co-optimized." Moreover, an additional degree of asymmetry is therefore introduced because the radio-frequency power entry can vary depending on the position in k-space.

In both cases it is also advantageous if the optimization takes place via the optimization method under consideration of at least one additional auxiliary parameter describing a sought imaging task. In this way it is consequently possible to also consider the concrete imaging task, and thus to determine the degree of asymmetry or, respectively, an asymmetry factor specific to the application, in particular specific to each examination.

In a further embodiment, the shortening of the excitation trajectory takes place depending on a predetermined limitation of the emitted radio-frequency power for the traversed points in k-space. As already noted, an additional degree of asymmetry can be introduced by variation of the radio-frequency power that is emitted at specific k-space points. It is advantageous to provide limitations for the global and/or local SAR, such as to comply with legal requirements as to SAR limitation. For example, these limitations can be introduced as boundary conditions in the optimization method and can consequently contribute to the determination of the degree of asymmetry, consequently to the specific shortening of the excitation trajectory.

As mentioned, it is advantageous for the excitation to take place using a transmission device designed for parallel transmission of radio-frequency pulses via different transmission channels. Tests have shown that the acceleration achieved by the parallel transmission, for example described by an acceleration factor, and the time gain achieved by the present invention can be combined without these effects measurably interfering. Otherwise stated, both degrees of optimization are essentially provided independently. The acceleration gained by the parallel transmission can consequently be further improved with the procedure according to the invention. The asymmetric k-space coverage of the excitation can be completed again in part by parallel transmission, and therefore completely or partially supplement the excitation k-space information (such a procedure is known as "TX SENSE"). With regard to parallel transmission it is generally also true that not only can the shortening of the excitation trajectory take place in addition to a temporal shortening of the excitation via undersampling given parallel transmission, but also the asymmetrical coverage of k-space via shortening of the excitation trajectory can additionally be partially or completely supplemented by the parallel transmission.

At least one excitation pulse (in particular a radio-frequency pulse) used to realize the excitation can be filtered, in particular by a windowing filter. Because the excitation trajectory in k-space is shortened, parts of the excitation are omitted, which means that the radio-frequency pulse is at least partially "truncated". Such an unsmooth termination of the radio-frequency pulse can lead, in individual cases, to limitations of the excitation quality and/or of the image quality. Known smoothing methods (for example using a windowing filter) consequently can be used within the scope of the present invention in order to smooth the shortened excitation overall, and to further improve the quality. The radio-frequency waveform of the radio-frequency pulse thus is filtered in order to suppress truncation effects.

In addition to the method according to the invention, the invention concerns a magnetic resonance apparatus that has a control device designed to implement the method according to the invention. All statements with regard to the method according to the invention apply analogously to the magnetic resonance apparatus according to the invention, so the magnetic resonance achieves the same advantages as the method. In particular, the magnetic resonance apparatus is designed to automatically determine the degree of asymmetry (in particular the asymmetry factor), with Bloch simulations preferably being implemented under consideration of B0 maps and B1 maps that are measured anyway.

DESCRIPTION OF THE PREFERRED EMBODIMENTS

Figure 1:
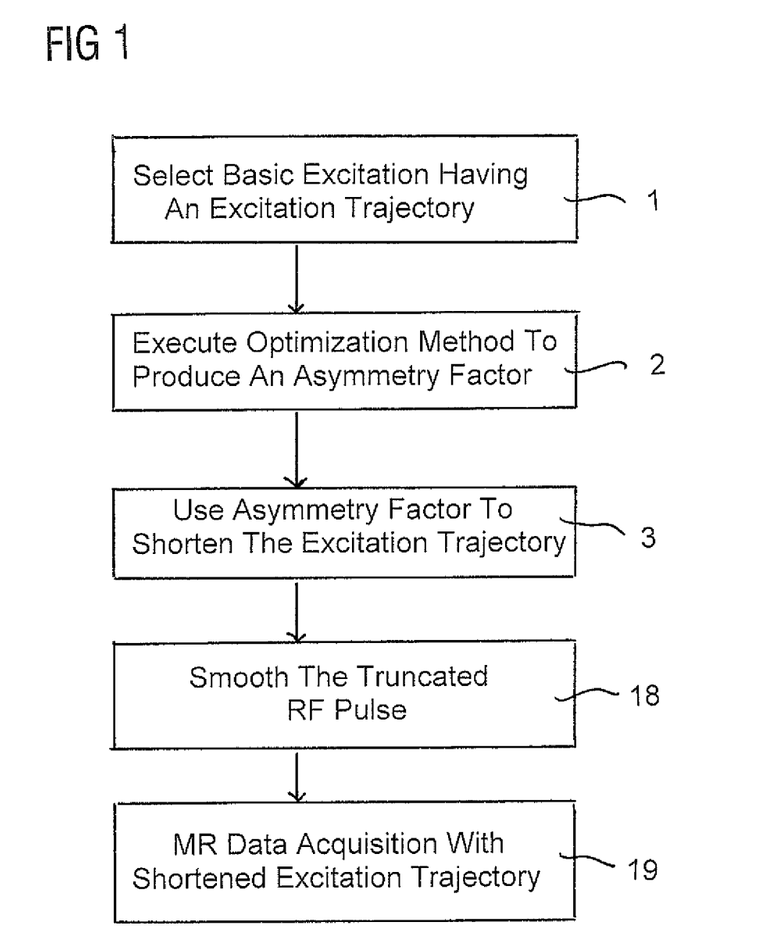
FIG. 1 is a flowchart of an embodiment of the method according to the invention.

FIG. 1 is a flowchart of an exemplary embodiment of the method according to the invention. The method generates an excitation within the scope of a magnetic resonance sequence that allows shortened excitation durations and shortened echo times within the magnetic resonance sequence. The excitation should take place in a spatially selective manner. In this context it is noted that a combination with parallel transmission (pTX) can also take place, given which a shortening of the duration of the excitation is already possible via undersampling of k-space during the excitation. Tests and simulations have shown that the shortening of excitation trajectories via introduction of an asymmetry in the method shown here can be combined with an acceleration via undersampling with pTX, without quality losses. In all exemplary embodiments shown herein, an EPI sequence (for which the method according to the invention can particularly advantageously be used) is considered as a magnetic resonance sequence.

In step 1, a basic excitation is initially selected that has an excitation trajectory having a symmetry relative to the k-space center in at least one direction of k-space, in the present case an excitation trajectory symmetrical in the x-, y- and z-direction of k-space. Its symmetry condition is described by the above Equation (3). This symmetry should now be abandoned in at least one of the symmetry directions in order to achieve a shortening of the excitation duration, preferably for the second part of the excitation trajectory—thus to shorten the portion of the excitation trajectory that lies after the crossing of the k-space center. The greatest gain with regard to the echo time is then to be achieved, wherein an effective echo time TE is presently considered that is defined as the time period from the crossing of the k-space center on the part of the excitation trajectory up to the point in time of the crossing of the k-space center on the part of the readout trajectory.

Basic excitations can include excitation trajectories in k-space of different types, wherein two-dimensional or three-dimensional echoplanar trajectories, stacks of spirals and radial trajectories are cited as partial examples discussed in detail in the following.

To shorten the excitation trajectory, Equation (4) is assumed, wherein presently—for simplicity—only one of the asymmetry factors $\alpha_x$, $\alpha_y$ and $\alpha_z$ actually deviates from 1, thus is chosen to be less than 1. For simplicity, this asymmetry factor deviating from 1 in the symmetry direction which is shortened should merely be designated as $\alpha$ in the following. However, exemplary embodiments of the method are also conceivable in which more than one asymmetry factor of the vector $\alpha$ is chosen to deviate from 1; in principle, embodiments are also conceivable in which at least one asymmetry factor is defined in symmetry directions deviating from the x-, y- and z-directions, and is chosen to be less than 1.

The selection of the asymmetry factor $\alpha$ takes place entirely in an automated manner, wherein it is conceivable to assess the pulse response—in particular in the form of PSF (point spread functions)—via an error measure in order to assess the reduction of the excitation quality and to keep it within predetermined limits in the selection of the asymmetry factor. However, an optimization method is preferably (and in this exemplary embodiment) used in step 2, in which a Bloch simulation is respectively implemented using predetermined B0 maps and B1 maps for different shortened trajectories (thus different asymmetry factors). Such B1 maps and B0 maps are determined anyway when a transmission device designed for parallel transmission (which transmission device consequently has multiple transmission channels) is used, such that the evaluation of the excitation quality is possible via Bloch simulations, without more effort. Just like the consideration of pulse responses, Bloch simulations are highly parallelizable, such that an execution in real time on a graphics card takes place in a present exemplary embodiment. Using B1 maps and B0 maps, the Bloch simulation ultimately allows the excitation qualities of excitations to be predicted with high precision for different asymmetry factors. The Bloch simulation is advantageously also extended by the readout sequence, consequently includes the entire magnetic resonance sequence, and also takes into account the T2* response of different nuclei, such that overall the signal-to-noise ratio (SNR) and the image quality can be estimated. An optimal asymmetry factor is then determined in an optimization method, wherein the excitation quality, the time gain due to the asymmetrization, and the SAR response are considered with weighting.

It is noted again that, for SAR limiting, maximum radio-frequency power introductions in k-space can be defined as boundary conditions, in particular also depending on the position in k-space; it is also conceivable to introduce an additional degree of asymmetry in that the radio-frequency power introduced at defined positions in k-space can be variably designed as additional parameters in the optimization method.

The result of the optimization method is then an asymmetry factor that is used in step 3 in order to shorten the excitation trajectory of the basic excitation, consequently to introduce the asymmetry. As noted, this optimally takes place such that the second part of the excitation trajectory in k-space (thus the portion after crossing the k-space center) is shortened, in particular truncated.

Figure 2:
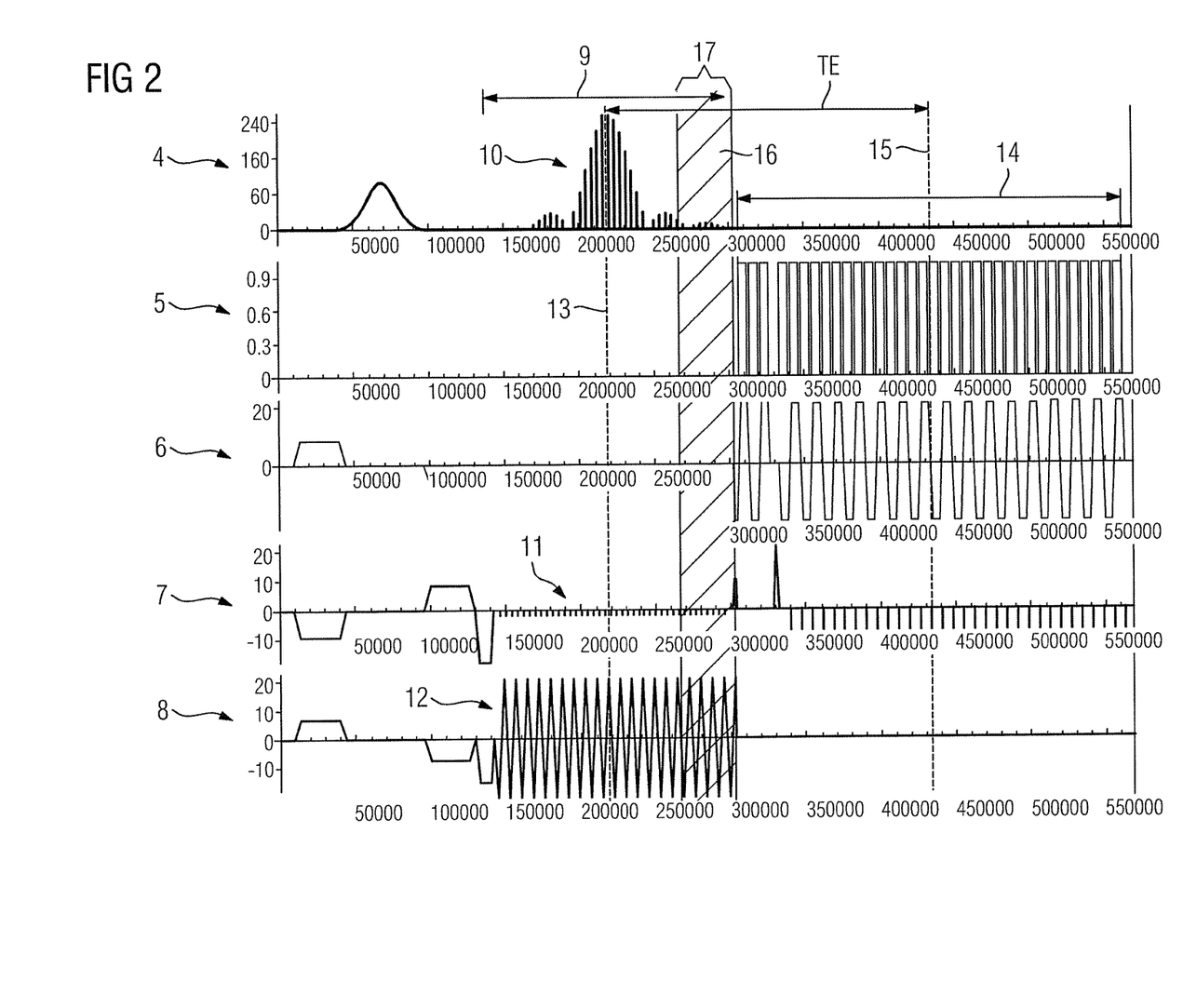
FIG. 2 shows a pulse sequence to explain the shortening of the excitation trajectory.

This shortening is schematically indicated in detail by FIG. 2. FIG. 2 shows an EPI sequence (which initially still uses the basic excitation) and the effects of the shortening in step 3. The uppermost graph 4 shows the signal curve of the radio-frequency pulses; the graph 5 concerns the ADC signals of the readout channel; the graph 6 concerns the x-gradient; the graph 7 concerns the y-gradient; and the lowermost graph 8 concerns the z-gradient. The basic excitation, described by different excitation pulses (here the radio-frequency pulse 10 and gradient pulses 11, 12) takes place during the excitation duration 9. The still-symmetrical excitation trajectory in k-space crosses the k-space center at a point in time 13.

Given an EPI sequence, the readout time period 14 follows as quickly as possible (only roughly indicated by a double arrow in FIG. 2). The readout trajectory in k-space crosses the k-space center at a point in time 15. The distance between the points in time 13 and 15 defines the effective echo time TE (likewise indicated).

If the asymmetry to be introduced (in the z-direction given a stack of partial trajectories that relate to planes situated in the x/y-direction) is now effectively chosen, the shortening of the excitation trajectory is expressed in a "truncation" of the excitation, as this is shown in FIG. 2 by the region 16 to be truncated. The excitation duration 9 is reduced by a shortening time period 17, such that the number of off-resonance effects is reduced; however, it is also clearly possible to reduce the effective echo time TE by the shortening time period 17 so that less signal decay occurs, and consequently a greater signal-to-noise ratio is achieved.

The actual excitation to be implemented in the shown method thus results from the basic excitation by omitting all pulse portions in region 16.

In order to avoid that unwanted truncation effects occur due to the truncation of the pulses, in step 18 (see FIG. 1) the truncated radio-frequency pulse 10 is smoothed via a filtering, as this is fundamentally known.

The data acquisition then takes place in step 19 with the shortened, asymmetrical excitation using the shortened excitation trajectory.

In the following, a few concrete examples should now be displayed for the application and results of the method.

Figure 3:
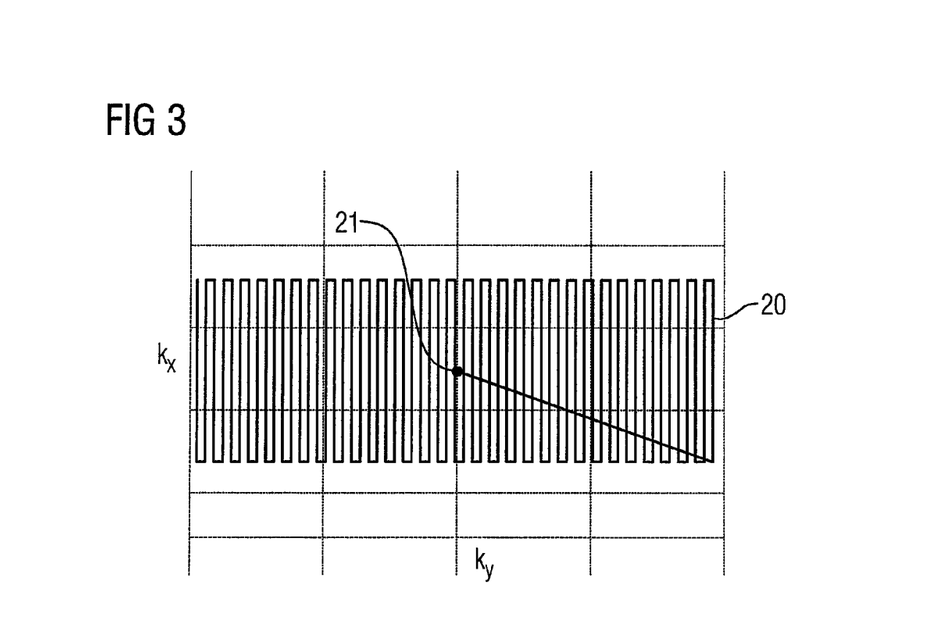
FIG. 3 illustrates a two-dimensional, unshortened excitation trajectory.
Figure 4:
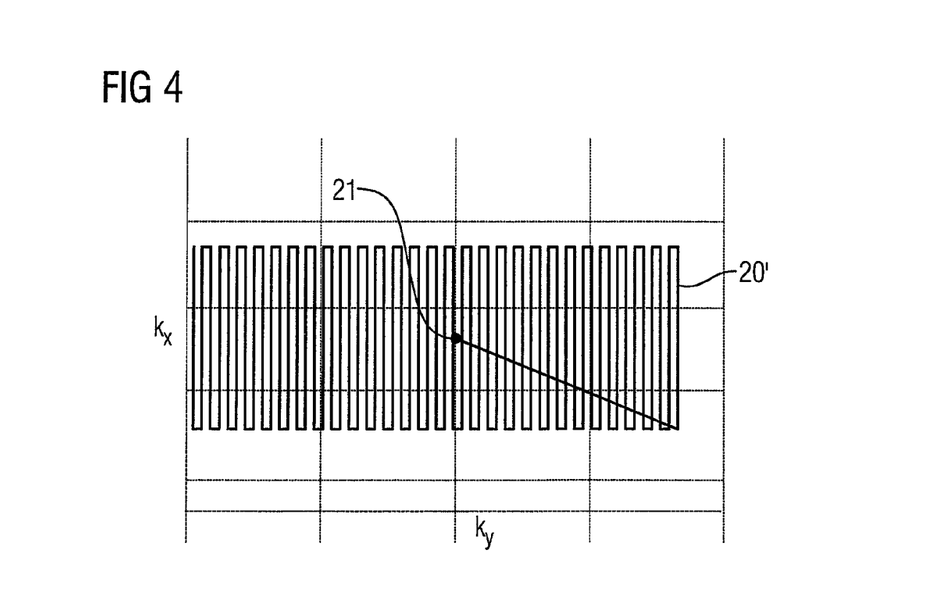
FIG. 4 illustrates an excitation trajectory shortened with an asymmetry factor of 0.9.
Figure 5:
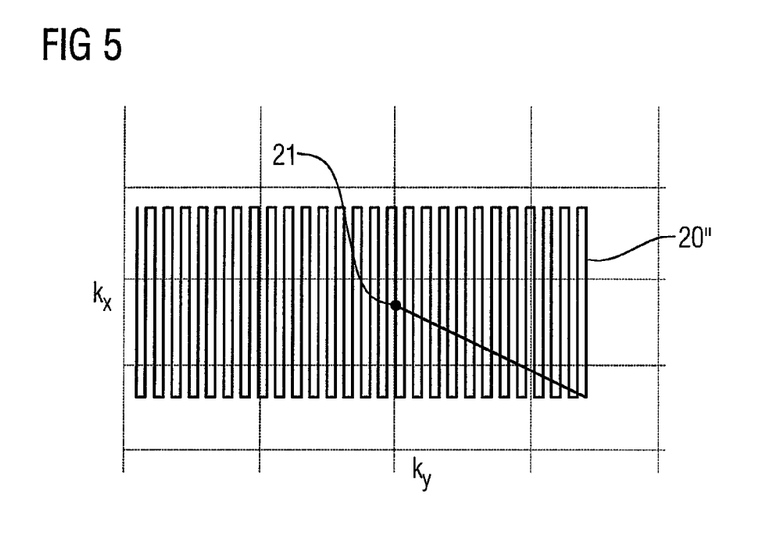
FIG. 5 illustrates an excitation trajectory shortened with an asymmetry factor of 0.75.
Figure 6:
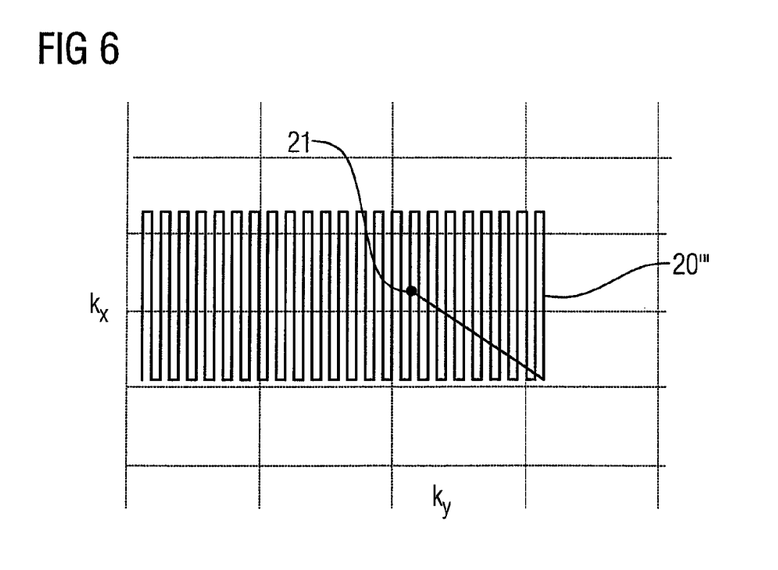
FIG. 6 illustrates an excitation trajectory shortened with an asymmetry factor of 0.6.

FIG. 3 shows a still-unshortened, symmetrical, two-dimensional echoplanar trajectory as an excitation trajectory 20. k-space is clearly scanned in a wandering manner, wherein the k-space center 21 is traversed by exactly half of the excitation trajectory 20. If an asymmetry factor is now applied in the y-direction in this two-dimensional excitation trajectory, the excitation trajectory 20 is shortened in that the second half is shortened (consequently is truncated) in order to achieve the time gain due to the shortening time period 17. FIGS. 4-6 show resulting shortened excitation trajectories 20', 20" and 20'" that respectively correspond to asymmetry factors $\alpha_y$ of 0.9, 0.75 and 0.6. The lengths of the shortening time period accordingly result at 2.5 ms, 4.5 ms and 7 ms, wherein these values can immediately be understood as shortening the echo time TE. For the case presented in FIGS. 3-6, an approximated formula to reduce the excitation duration 9 and the echo time TE can be determined as $$TE' - TE \approx -(1-\alpha_y) * 0.5 \, T_{pulse}, \quad (5)$$

wherein $T_{pulse}$ is the excitation duration 9. Measurements and simulations would have the result that the excitation quality is maintained or even improved if the reduced off-resonance effects are taken into account. If the asymmetry factor is chosen to be even smaller (for example as 0.5), even greater echo time gains and excitation duration gains can be achieved.

Figure 7:
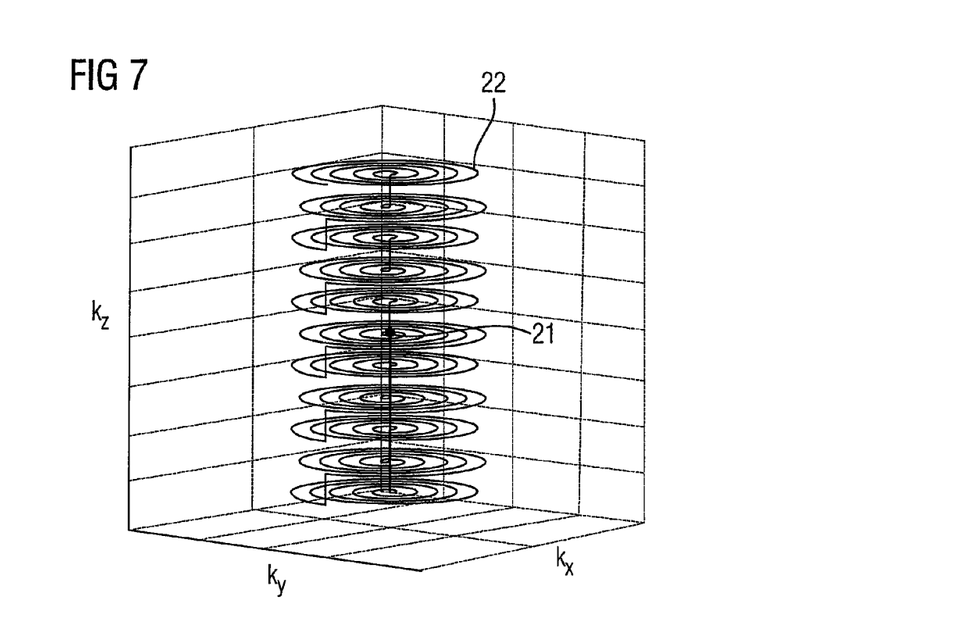
FIG. 7 illustrates a shortened excitation trajectory formed by a stack of spirals.
Figure 8:
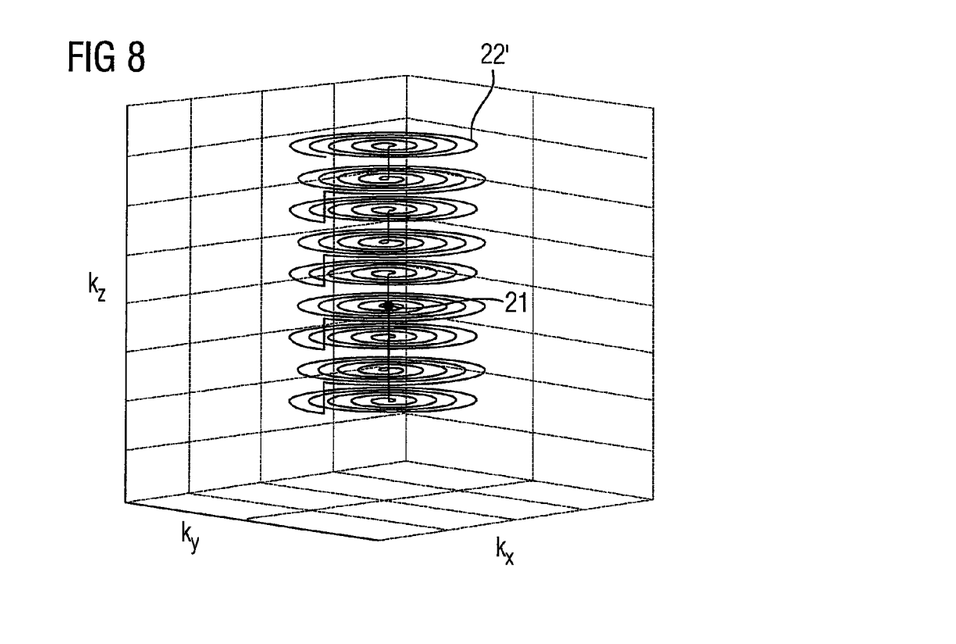
FIG. 8 illustrates an excitation trajectory shortened with the asymmetry factor of 0.6, based on FIG. 6.

FIGS. 7 and 8 show an additional concrete exemplary embodiment in which a still-unshortened three-dimensional excitation trajectory 22 is assumed that is provided as partial trajectories through a stack of spirals. Five spirals lie above the plane in which the k-space center 21 lies; five of the spirals lie below. The spirals follow one another in the z-direction, which consequently is suggested as a symmetry direction in which the excitation trajectory 22 can be shortened. If an asymmetry factor $\alpha_z$ of 0.6 is considered, the shortened excitation trajectory 22' of FIG. 8 results. A shortening time period of 3 ms hereby results given an excitation duration of 12 ms. The excitation quality thereby barely changes. If an RMSE quality measure (root mean squared error quality measure) of 0.79 is achieved as a measure of the excitation quality for $\alpha_z=1$ (thus the excitation trajectory 22), this increases only minimally to 0.83 for the shortened excitation trajectory 22', as simulations and experiments show.

Figure 9:
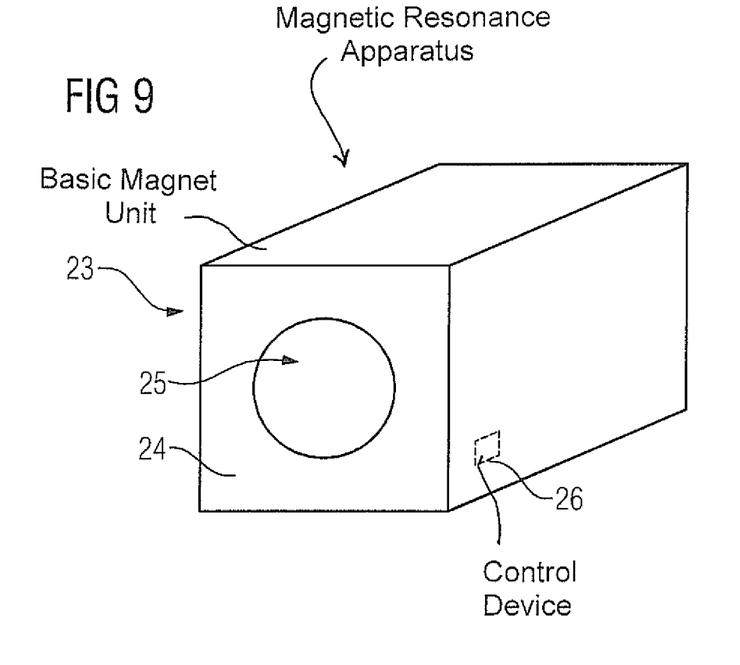
FIG. 9 schematically illustrates a magnetic resonance apparatus according to the invention.

FIG. 9 schematically illustrates a magnetic resonance apparatus 23 according to the invention. As is known, such an apparatus has a basic magnet unit 24 that defines a patient receptacle 25 that can be provided surrounding a radiofrequency coil arrangement and a gradient coil arrangement. The operation of the magnetic resonance apparatus 23 is controlled by a control device 26 that is designed to implement the method according to the invention, in particular thus for automatic, sequence-specific and application-specific determination of an optimal asymmetry factor and for excitation by means of a shortened excitation trajectory, as has been described.

Although modifications and changes may be suggested by those skilled in the art, it is the intention of the inventor to embody within the patent warranted hereon all changes and modifications as reasonably and properly come within the scope of his contribution to the art.

We claim as our invention:

1. A computerized method to generate a spatially selective excitation of nuclear spins in a subject situated in an imaging region of a magnetic resonance apparatus, preceding acquisition of diagnostic magnetic resonance data, comprising:
providing a computerized processor with a basic excitation sequence, that will excite said nuclear spins by causing said magnetic apparatus to radiate an excitation and to activate a gradient field that occurs while said excitation pulse is radiated, and thereby causing an excitation trajectory to be traversed in k-space, said excitation trajectory having a symmetry relative to a center of k-space in at least one direction of k-space, said at least one direction comprising extreme values, and said symmetry relative to said center of k-space being defined by a first-traversed extreme value of said excitation trajectory in said at least one direction and a corresponding negative of said first-traversed extreme value that forms the other extreme value in said at least one direction;
in said computerized processor, operating on said basic excitation sequence to shorten said excitation trajectory in said at least one direction on one side of a zero point between said extreme values; and
making said basic excitation, with said shortened excitation trajectory, available in electronic form at an output of said computerized processor in a control protocol having a format for operating said magnetic resonance apparatus to acquire said diagnostic magnetic resonance data with said nuclear spins being spatially selectively excited.

2. A method as claimed in claim 1 comprising shortening said excitation trajectory by shortening a portion of said excitation trajectory that occurs after traversal of said center of k-space by said excitation trajectory.

3. A method as claimed in claim 2 comprising shortening said excitation trajectory by shortening only said portion of said excitation trajectory that occurs after traversal of said center of k-space by said excitation trajectory.

4. A method as claimed in claim 1 comprising shortening said excitation trajectory by omitting planes situated orthogonally to said at least one direction and covered by partial trajectories in k-space.

5. A method as claimed in claim 1 comprising shortening said excitation trajectory by truncating a portion of said excitation trajectory that traverses successive k-space values in said at least one direction after crossing said center of k-space.

6. A method as claimed in claim 1 comprising using, as said excitation trajectory, an excitation trajectory selected from the group consisting of an echoplanar trajectory, a spiral stack, and a radial scan trajectory.

7. A method as claimed in claim 1 comprising shortening said excitation trajectory to give said shortened excitation trajectory an asymmetry described by an asymmetry factor that is less than 1 by multiplying said negative extreme value by said asymmetry factor.

8. A method as claimed in claim 7 wherein said asymmetry factor is between 0.5 and 1.

9. A method as claimed in claim 7 comprising shortening said excitation trajectory by executing an optimization method in said computerized processor that determines an asymmetry factor of the shortened excitation time by weighting an excitation quality and a time gain with regard to a duration of at least one of the excitation and echo time associated with said control protocol.

10. A method as claimed in claim 1 comprising shortening said excitation trajectory by executing an optimization method in said computerized processor by weighting an excitation quality and a time gain with regard to a duration of at least one of the excitation and echo time associated with said control protocol.

11. A method as claimed in claim 10 comprising, in said optimization method, determining and evaluating pulse responses for different shortened excitation trajectories.

12. A method as claimed in claim 10 comprising executing a Bloch simulation for each of a plurality of different shortened excitation trajectories using predetermined B1 maps, to determine said loss of excitation quality.

13. A method as claimed in claim 12 comprising also implementing said Bloch simulation with regard to an entirety of said magnetic resonance sequence, or said subject, to obtain respective values for image qualities and specific absorption ratios, and using said values and said optimization method.

14. A method as claimed in claim 10 comprising also adapting a power emitted to achieve said excitation at a point in k-space, as a further parameter in said optimization method.

15. A method as claimed in claim 10 comprising executing said optimization method dependent on at least one parameter that describes a sought imaging task.

16. A method as claimed in claim 1 comprising shortening said excitation trajectory dependent on a predetermined limitation of emitted radio frequency power for points in k-space that are traversed by said excitation trajectory.

17. A method as claimed in claim 1 comprising generating said control protocol as a protocol for parallel transmission of radio frequency pulses via different transmission channels of said magnetic resonance apparatus.

18. A method as claimed in claim 16 comprising also temporally shortening said excitation in said control protocol by undersampling with said parallel transmission.

19. A method as claimed in claim 1 comprising generating at least one radio frequency pulse in said control protocol using a windowing filter to smooth said radio frequency pulse.

20. A magnetic resonance (MR) apparatus comprising:
an MR data acquisition unit having an imaging volume in which an examination subject is situated;
an electronic memory organized as k-space;
a computerized processor provided with a basic excitation sequence, that will excite nuclear spins in said subject by causing said MR data acquisition unit to radiate an excitation and to activate a gradient field that occurs while said excitation pulse is radiated, and thereby causing an excitation trajectory to be traversed in k-space when MR data are acquired by said MR data acquisition unit and entered into said memory, said excitation trajectory having a symmetry relative to a center of k-space in at least one direction of k-space, said at least one direction comprising extreme values, and said symmetry relative to said center of k-space being defined by a first-traversed extreme value of said excitation trajectory in said at least one direction and a corresponding negative of said first-traversed extreme value that forms the other extreme value in said at least one direction;
said computerized processor being configured to operate on said basic excitation sequence to shorten said excitation trajectory in said at least one direction on one side of a zero point between said extreme values; and
said computerized processor being configured to incorporate said basic excitation, with said shortened excitation trajectory, in electronic form at an output of said computerized processor in a control protocol and to operate said MR data acquisition unit according to said protocol to acquire said diagnostic magnetic resonance data with said nuclear spins being spatially selectively excited.

* * * * *